United States Patent
Joung et al.

(10) Patent No.: US 7,782,233 B2
(45) Date of Patent: Aug. 24, 2010

(54) METHOD AND APPARATUS FOR ENCODING/DECODING POINT SEQUENCES ON LASER BINARY REPRESENTATION

(75) Inventors: Ye Sun Joung, Daejeon (KR); Ji Hun Cha, Daejeon (KR); Won Sik Cheong, Daejeon (KR); Kyu Heon Kim, Daejeon (KR); Young Kwon Lim, Kyunggi-do (KR)

(73) Assignees: Electronics and Telecommunications Research Institute, Daejeon (KR); Net & TV, Inc., Seoul (KR)

( * ) Notice: Subject to any disclaimer, the term of this patent is extended or adjusted under 35 U.S.C. 154(b) by 783 days.

(21) Appl. No.: 11/575,983

(22) PCT Filed: Oct. 13, 2005

(86) PCT No.: PCT/KR2005/003415
§ 371 (c)(1),
(2), (4) Date: Mar. 26, 2007

(87) PCT Pub. No.: WO2006/041259
PCT Pub. Date: Apr. 20, 2006

(65) Prior Publication Data
US 2008/0063114 A1  Mar. 13, 2008

(30) Foreign Application Priority Data
Oct. 13, 2004 (KR) .......... 10-2004-0081789
Jan. 14, 2005 (KR) .......... 10-2005-0003864

(51) Int. Cl.
*H03M 7/00* (2006.01)
(52) U.S. Cl. .......... 341/107; 341/50; 341/51; 341/65; 341/67; 341/106; 375/240.12; 375/240.16; 375/240.18; 375/240.24; 382/238; 382/246; 382/248; 382/253

(58) Field of Classification Search .......... 341/50, 341/51, 65, 67, 106, 107; 375/240.12, 240.16, 375/240.18, 240.24; 382/238, 246, 248, 382/253
See application file for complete search history.

(56) References Cited

U.S. PATENT DOCUMENTS
6,011,496 A   1/2000   Park et al.
(Continued)

FOREIGN PATENT DOCUMENTS
| EP | 1104198 | 11/1999 |
| JP | 8-116447 A | 5/1996 |
| JP | 2001-189662 | 7/2001 |
| JP | 2004-104159 A | 4/2004 |
| KR | 10-0338801 | 5/2002 |

OTHER PUBLICATIONS
Golomb, Solomon W., "Run-Length Encodings", 1966, *IEEE Transactions on Information Theory*, vol. 12, Issue 3, pp. 399-401.
(Continued)

*Primary Examiner* — Linh V Nguyen
(74) *Attorney, Agent, or Firm* — Ladas & Parry LLP (57) ABSTRACT

Provided are a method and an apparatus for selectively encoding/decoding point sequences to maximize bit efficiency of a lightweight application scene representation (LASeR) binary stream. The point sequence encoding method includes the steps of: for each point sequence, (a) selecting one of exponential-Golomb (EG) encoding and fixed length (FL) encoding schemes; (b) when the FL encoding scheme is selected, encoding the point sequence using the FL encoding scheme to generate a binary stream; and (c) when the EG encoding scheme is selected, encoding the point sequence using the EG encoding scheme to generate a binary stream. The binary stream includes a flag indicating which encoding scheme is selected and a parameter k, with which the EG encoding can be most effectively performed, when the EG encoding scheme is selected. According to the encoding method, LASeR point sequences can be efficiently encoded and, during a decoding process, a large overhead is not incurred to a decoder (terminal).

17 Claims, 2 Drawing Sheets

U.S. PATENT DOCUMENTS

| | | | | |
|---|---|---|---|---|
| 6,118,392 | A * | 9/2000 | Levine | 341/60 |
| 6,621,869 | B2 | 9/2003 | Talluri et al. | |
| 6,650,784 | B2 * | 11/2003 | Thyagarajan | 382/244 |
| 6,987,468 | B1 * | 1/2006 | Malvar | 341/59 |
| 6,993,202 | B2 * | 1/2006 | Igarashi et al. | 382/246 |
| 7,209,059 | B2 * | 4/2007 | Lim et al. | 341/67 |
| 7,221,296 | B2 * | 5/2007 | Ziauddin et al. | 341/107 |
| 7,436,329 | B2 * | 10/2008 | Lynch et al. | 341/51 |
| 7,447,372 | B2 * | 11/2008 | Kishore et al. | 382/246 |
| 7,469,012 | B2 * | 12/2008 | MacInnis et al. | 375/240.25 |
| 7,580,585 | B2 * | 8/2009 | Malvar | 382/245 |
| 2003/0215018 | A1 | 11/2003 | MacInnis et al. | |
| 2004/0008769 | A1 | 1/2004 | Winger | |
| 2005/0275570 | A1 * | 12/2005 | Wang | 341/65 |
| 2006/0224646 | A1 * | 10/2006 | Kishore et al. | 708/204 |
| 2006/0242544 | A1 * | 10/2006 | Kishore et al. | 714/779 |

OTHER PUBLICATIONS

Dufourd, Jean-Claude, et al., "Core Experiment on LASeR Binary Representation", Jul. 2004, *ISO/IEC JTC 1/SC 29/WG 11*.

Iain E.G. Richardson; "H.264 and MPEG-4 Video Compression Video Coding for Next-Generation Multimedia", John Wiley and Sons Ltd, p. 198-200 © 2003, (exact date not given).

* cited by examiner

METHOD AND APPARATUS FOR ENCODING/DECODING POINT SEQUENCES ON LASER BINARY REPRESENTATION

TECHNICAL FIELD

The present invention relates to a method and an apparatus for efficiently encoding/decoding point sequences, and more particularly, to a method and an apparatus for efficiently encoding/decoding lightweight application scene representation (LASeR) point sequences.

BACKGROUND ART

LASeR is a multimedia content format defined to provide simple multimedia services to resource-limited devices such as mobile phones. LASeR can be used for applications such as map applications, animation, and 2-dimensional vector graphics. Such applications work with a large amount of point data, so a method for efficiently encoding point data is required. To this end, two major factors of LASeR should be considered: an efficient binary representation and a small decoder memory.

LASeR Text of the International Standardization Organization/International Electrotechnical Commission (ISO/IEC) 14496-20 Committee Draft (CD) published on July 2004 proposes a fixed length (FL) encoding scheme to encode LASeR point data. According to the FL encoding scheme, point data itself is encoded when a number of points, nbPoint, is less than three. When the number, nbPoint, is three or more, all point sequences are examined to determine a dynamic range of them and point sequences are encoded using a fixed length derived from the examination result. The method can be implemented very simply. However, not only is there an overhead of ten bits in order to designate a length field on each point sequence, but there are also many bits unnecessarily allocated to a data field following the length field.

Entropy encoding and decoding may be considered to efficiently compress and restore image data. Entropy encoding is a method that considers various values which data can take and encodes the frequently-taken values using a small number of bits.

There are various entropy encoding schemes, which can be roughly classified into ones with an encoding table and ones without an encoding table. Huffman encoding scheme is a representative scheme using an encoding table. According to Huffman encoding scheme, a most optimized compression rate can be obtained. However, an encoding table must be transmitted, and there is a process overhead in a decoder (terminal) in that it has to access a memory location every time point data is decoded. Since the LASeR needs a small memory with minimal complexity, Huffman encoding scheme using an encoding table is not appropriate for encoding point data.

As other entropy encoding scheme, i.e., the encoding schemes not using an encoding table, there are arithmetic encoding and exponential golomb (EG) encoding schemes. Arithmetic encoding is an efficient encoding method but hard to use for LASeR due to the lack of error resilience.

On the other hand, the EG encoding scheme has some characteristics appropriate for LASeR. According to EG encoding scheme, a parameter k, which gives a low overhead to an encoder and is appropriate for a specific distribution, may be selected. In addition, the EG encoding can be easily converted into variable-length coding (VLC), in order to add an error resilient function (refer to "Reversible VLC for Added Error Resilience" by ISO/IEC Joint Technical Committee (JTC) 1/Section Committee (SC) 29/Working Group (WG) 1 (International Telecommunication Union-Telecommunication Standardization Section, Study Group 8 (ITU-T SG8)). Yet another advantage is a low decoder overhead. Since a decoding process can be performed by only addition and bit shift operations, the EG encoding scheme can be applied to low-end devices such as mobile phones without incurring a high overhead.

DISCLOSURE OF INVENTION

Technical Problem

The present invention is directed to a method and an apparatus for encoding point sequences, which selects a point sequence encoding scheme to improve a compression efficiency of a LASeR binary representation; encodes a flag indicating which encoding scheme is selected and a value of a parameter k used for EG encoding, when the EG encoding scheme is selected; and transmits the flag and the value of the parameter k, together with a LASeR binary stream.

The present invention is also directed to a method and an apparatus for decoding point sequences, which extracts from an encoded LASeR stream a flag indicating which encoding scheme is used; determines a decoding scheme based on the flag; extracts a parameter k when EG decoding scheme is selected; and decodes the encoded LASeR stream.

TECHNICAL SOLUTION

The present invention proposes a method and an apparatus for selective encoding/decoding point sequences, in order to maximize a bit efficiency of LASeR binary representation.

One aspect of the present invention provides a method for encoding LASeR point sequences, comprising the steps of: for each point sequence, (a) selecting one of exponential-Golomb (EG) encoding and fixed length (FL) encoding schemes; (b) when the FL encoding scheme is selected, encoding the point sequence using the FL encoding scheme to generate a binary stream; and (c) when the EG encoding scheme is selected, encoding the point sequence using the EG encoding scheme to generate a binary stream, wherein the binary stream includes a flag indicating which encoding scheme is selected and a parameter k, with which the EG encoding can be most effectively performed, when the EG encoding scheme is selected.

Another aspect of the present invention provides a method for decoding a LASeR binary stream that comprises the steps of: extracting, from the LASeR binary stream, information indicating which encoding scheme is used, and determining one of EG decoding and FL decoding schemes on the basis of the extracted information; and decoding the LASeR binary stream according to the determined decoding scheme.

Yet another aspect of the present invention provides a server comprising: an encoding means for encoding LASeR point sequences representing a scene description by performing above-explained decoding method to generate an encoded LASeR scene description stream; a multiplexing means for multiplexing the encoded LASeR scene description stream and other element streams composing the LASeR scene to generate a multiplexed LASeR binary stream; and a transmitting means for transmitting the multiplexed LASeR binary stream to a user terminal.

Still another aspect of the present invention provides a user terminal comprising: a receiving means for receiving a LASeR binary stream; a demultiplexing means for de-multiplexing and outputting a LASeR scene description stream and other element streams from the received LASeR binary stream; a decoding means for decoding a LASeR scene description stream output from the demultiplexing means by performing above-explained decoding method to generate a plurality of decoded LASeR access units which can be separately accessed; an additional decoding means for decoding the other element streams output from the demultiplexing means; a scene tree manager for generating a scene tree from the decoded access units; and a LASeR renderer for providing a LASeR service using the generated scene tree and the decoded other element streams.

Still yet another aspect of the present invention provides a data structure of a data stream of an encoded LASeR point sequence, comprising: a flag for indicating which one of FL and EG encoding schemes is used; and a parameter k with which the EG encoding can be most effectively performed, when the flag has a value indicating the EG encoding scheme.

ADVANTAGEOUS EFFECTS

As described above, when a point sequence is encoded/decoded according to the encoding method of the present invention, a compression gain of between 6 and 17% can be obtained. Therefore, when the encoding method according to the present invention is used for applications such as a map, animation, and vector graphics, excellent compression efficiency is obtained using a decoder having a low complexity.

MODE FOR THE INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

Figure 1:
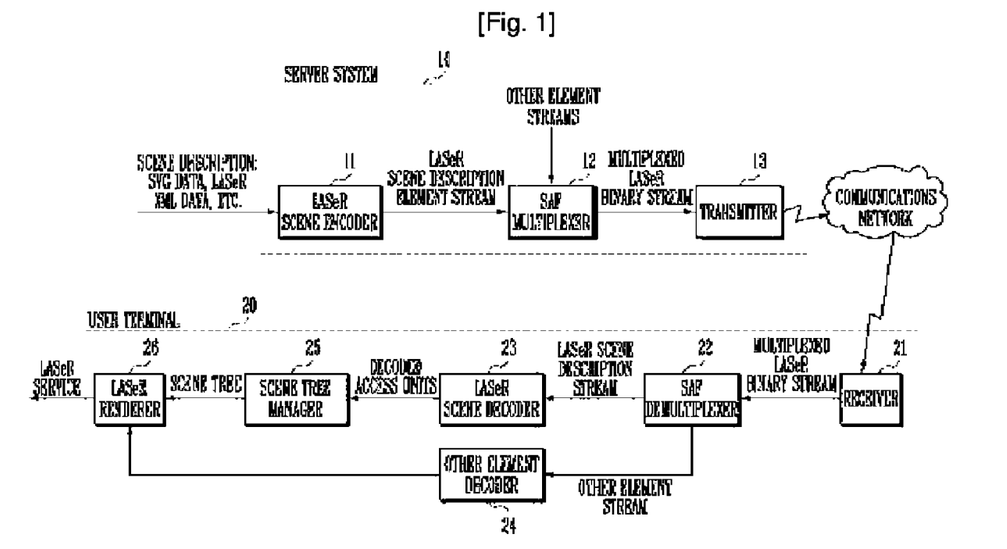
FIG. 1 shows a block diagram of a system for selectively encoding/decoding LASeR point sequences according to the present invention.

FIG. 1 shows a block diagram of a system for selectively encoding/decoding LASeR point sequences according to the present invention. As illustrated in FIG. 1, a server system 10 includes a LASeR scene encoder 11, a simple aggregation format (SAF) multiplexer 12, and a transmitter 13. The LASeR scene encoder 11 receives scene description data, e.g., scalable vector graphics (SVG) data, LASeR extensible markup language (XML) data, etc., about a scene and generates a compressed (encoded) LASeR scene description stream. A method for selectively encoding LASeR point sequences according to the present invention is applied to the LASeR scene encoder 11.

The SAF multiplexer 12 receives the LASeR scene description stream and other element streams composing a LASeR scene, e.g., video, audio, image, font, metadata streams, and so forth and generates a multiplexed LASeR binary stream. The transmitter 13 transmits the LASeR binary stream to a user terminal 20 using Internet protocol (IP), wireless Internet, a code division multiple access (CDMA) network, etc.

The user terminal 20 includes a receiver 21, an SAF demultiplexer 22, a LASeR scene decoder 23, other element decoder 24, a scene tree manager 25, and a LASeR renderer 26. The SAF demultiplexer 22 receives a data stream transmitted by the receiver 21 and de-multiplexes it to generate a LASeR scene description stream and other element streams. The LASeR scene decoder 23 receives the LASeR scene description stream output from the SAF demultiplexer 22 and generates decoded access units. An access unit is a part of data that can be independently accessed. A method for decoding LASeR point sequences according to the present invention may be applied to the LASeR decoder 23.

The other element decoder 24 decodes the other element streams, e.g., video, audio, image, font, metadata streams, and so forth, except for the LASeR description stream. A scene tree manager 25 receives the decoded access units and generates a scene tree. The scene tree means a hierarchy of scene description data, which shows the temporal/spatial locations of objects composing a LASeR scene. The LASeR renderer 26 receives the scene tree and other element streams of various forms output from the other element decoder 24, and provides a user with a LASeR service.

Figure 2:
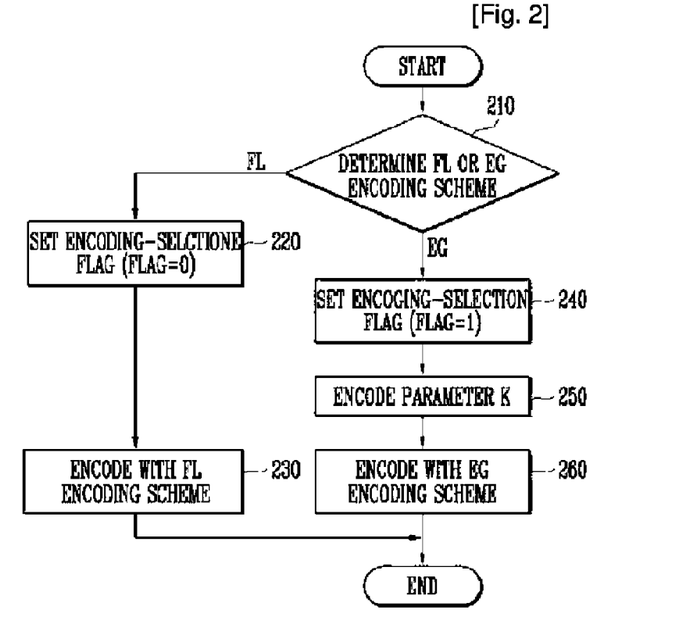
FIG. 2 shows a flowchart of a process of encoding point sequences according to the present invention.

FIG. 2 shows a flowchart of a process of encoding point sequences according to the present invention. For each point sequence, one of FL (fixed length) encoding and EG (exponential Golomb) encoding schemes is selected (step 210). Specifically, in an exemplary embodiment, after both of the EG encoding and FL encoding schemes are performed, an encoding scheme that generates a fewer number of bits is selected. When the FL encoding scheme is selected, an encoding-selection flag is set into '0' (flag=0) (step 220). And then, a point sequence is encoded using the FL encoding scheme (step 230).

The FL encoding can be performed according to the following process.

When a point sequence is assumed to be comprised of (n+1) number of points: $(x_0, y_0), (x_1, y_1), \ldots, (x_n, y_n)$, and 1) the number of points is two or less:

i) the minimum number of bits with which all of $x_0$, $y_0$, $x_1$, and $y_1$ can be encoded is calculated and encoded, and ii) points $(x_0, y_0)$ and $(x_1, y_1)$ are encoded using the number of bits calculated above, or 2) the number of points is three or more:

i) the minimum number of bits with which the point $(x_0, y_0)$ can be encoded is calculated and encoded, ii) point $(x_0, y_0)$ is encoded using the number of bits calculated above, iii) $dx_{10}, \ldots, dx_{nn-1}$ (here, $dx_{nn-1}=x_n-x_{n-1}$) are calculated and then the number, bitsx, of bits required for encoding them is calculated, iv) $dy_{10}, \ldots, dy_{nn-1}$ (here, $dy_{nn-1}=y_n-y_{n-}$) are calculated and then the number, bitsy, of bits required for encoding them is calculated, v) the numbers of bits, bitsx and bitsy, are encoded, and vi) $dx_{10}, dy_{10}, \ldots, dx_{nn-1}, dy_{nn-1}$ are encoded.

On the other hand, when the EG encoding scheme is selected, the encoding-selection flag is set to '1' (flag=1) (step 240). Subsequently, the parameter k with which EG encoding can be most effectively performed is calculated and encoded (step 250). Subsequently, the point sequence is encoded according to the EG encoding scheme (step 260).

EG encoding, which is one of entropy encoding schemes, has the systematic configuration mechanism advantageous to the compression of a point sequence in which small numbers frequently occur, by allocating shorter codes to small numbers. Huffman encoding scheme, which is another entropy encoding scheme, requires a code table that designates relationships between symbols and code numbers. In addition, the code table should be stored in a user terminal. On the contrary, the EG encoding scheme employs the systematic configuration method, and thus does not require a code table. Therefore, the EG encoding scheme is more appropriate for LASeR. The EG encoding scheme does not allocate a code word according to an accurate symbol statistic. Rather, the EG encoding scheme adjusts the parameter k, and thus can match various dispersions of a geometric distribution. According to the EG encoding scheme, each code is configured as follows:

[M zeros][1][INFO]

Here, M denotes the number of leading zeros, and INFO denotes a suffix offset value of (M+k) bits carrying information. The leading zeros and the following "1" serve as a prefix code that divides each code. A code number CodeNum is determined as follows:

$$\text{CodeNum}=2^{M+k}+\text{INFO}-2^k \qquad \text{Formula 1}$$

Since a value of INFO does not affect a length of the leading zeros, the number M of leading zeros can be calculated by ignoring the term INFO in Formula 1, as shown in Formula 2:

$$M=\lfloor \log_2(\text{CodeNum}+2^k)\rfloor-k \qquad \text{Formula 2}$$

And, the value of INFO can be calculated according to Formula 3 which is derived from Formula 2:

$$\text{INFO}=\text{CodeNum}+2^k-2^{M+k} \qquad \text{Formula 3}$$

As an example, the following Table 1 shows eleven EG encoding codes that are configured for the parameter k=0, 1, 2, and 3.

TABLE 1

| CodeNum | Code (k = 0) | Code (k = 1) | Code (k = 2) | Code (k = 3) |
| --- | --- | --- | --- | --- |
| 0 | 1 | 10 | 100 | 1000 |
| 1 | 010 | 11 | 101 | 1001 |
| 2 | 011 | 0100 | 110 | 1010 |
| 3 | 00100 | 0101 | 111 | 1011 |
| 4 | 00101 | 0110 | 01000 | 1100 |
| 5 | 00110 | 0111 | 01001 | 1101 |
| 6 | 00111 | 001000 | 01010 | 1110 |
| 7 | 0001000 | 001001 | 01011 | 1111 |
| 8 | 0001001 | 001010 | 01100 | 010000 |
| 9 | 0001010 | 001011 | 01101 | 010001 |
| 10 | 0001011 | 001100 | 01110 | 010010 |

As shown in Table 1, a code increases in a logical order.

Since an EG code has only a code number without a sign, an EG code with a sign should be mapped into an EG code without a sign. A code number CodeNum of an EG code without a sign is retrieved from a bit stream and mapped into an EG code with a sign, thereby being parsed.

(CodeNum is 0) signed code=0;
else if (CodeNum is even) signed code=−CodeNum/2;
else if (CodeNum is odd) signed code=(CodeNum+1)/2;

Examples for mapping a code number without a sign into a code number with a sign are shown in the following table:

TABLE 2

| EG code number not having a signal | 0 | 1 | 2 | 3 | 4 | 5 | 6 | 7 | 8 | 9 | ... |
| --- | --- | --- | --- | --- | --- | --- | --- | --- | --- | --- | --- |
| EG code number having a signal | 0 | 1 | −1 | 2 | −2 | 3 | −3 | 4 | −4 | 5 | ... |

In an exemplary embodiment, EG encoding can be performed according to the following process:

When a point sequence is assumed to be comprised of (n+1) number of points of $(x_0, y_0), (x_1, y_1), \ldots, (x_n, y_n)$, (1) the minimum number of bits with which the point $(x_0, y_0)$ can be encoded is calculated and encoded;

(2) point $(x_0, y_0)$ is encoded using the minimum number of bits; and (3) for each point except the point $(x_0, y_0)$, x-coordinate and y-coordinate differential data between a previous point and a current point are mapped into EG code numbers and EG code words corresponding to the x-coordinate and y-coordinate differential data are generated using the EG code numbers and the parameter k value, thereby performing EG encoding.

Specifically, the following process is performed to encode one point $(x_i, y_i)$.

(i) A difference, "diffx," between $x_i$ and $x_{i-1}$ is mapped into an EG code number CodeNum without a sign, according to the rule given below:

If (diffx>=0)CodeNum=diffx*2−1;
else CodeNum=|diffx|*2.

(ii) M denoting the number of leading zeros is calculated by Formula 2.

(iii) M number of "0" bits are recorded.

(iv) one "1" bit is recorded.

(v) The suffix offset "INFO," which carries information, is calculated by Formula 3.

(vi) INFO is recorded in (M+k) bits;

(vii) A difference "diffy" between $y_i$ and $y_{i-1}$ is mapped into an EG code number CodeNum without a sign, according to the rule:

If (diffy>=0)CodeNum=diffy*2−1; and
else CodeNum=|diffy|*2.

(viii) the number "M" of leading zeros is calculated by Formula 2, (ix) M number of "0" bits are recorded.

(x) One "1" bit is recorded.

(xi) INFO is calculated by Formula 3.

(xii) INFO is recorded in the (M+k) bits.

Figure 3:
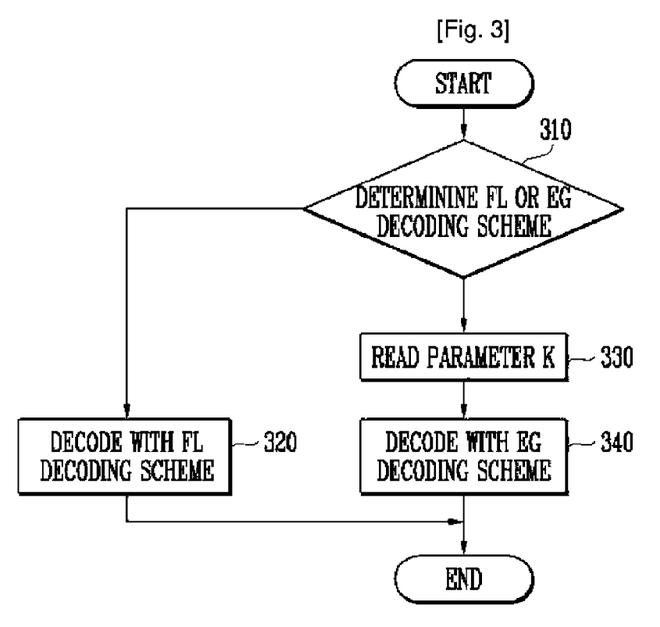
FIG. 3 shows a flowchart of a process of decoding point sequences according to the present invention.

FIG. 3 is a flowchart of a process of decoding point sequences according to the present invention. As illustrated in FIG. 3, for a LASeR binary stream, one of an FL decoding scheme and an EG decoding scheme is determined (step 310). The determination can be made by reading an encoding-selection flag included in the LASeR binary stream. As described above, since the encoding-selection flag included in the LASeR binary stream indicates which encoding scheme is used to encode a current point sequence, a decoding scheme is determined based on the flag.

When the FL decoding scheme is determined, the point sequence is decoded using the FL decoding scheme (step 320). The FL decoding can be performed according to the following process:

When the LASeR binary stream is assumed to be decoded into a point sequence of $(x_0, y_0), (x_1, y_1), \ldots, (x_n, y_n)$, (1) the number of points in the point sequence is extracted from the LASeR binary stream;

(2) the number "bits" of the bits required for an x-coordinate value and a y-coordinate value of a point is extracted from the LASeR binary stream;

(3) when the number of points is two or less, each value of $x_0, y_0, x_1,$ and $y_1$ is extracted by reading "bits" number of bits; and (4) when the number of points is three or more:

(i) each value of $x_0$ and $y_0$ is extracted by reading "bits" number of bits;

(ii) the number "bitsx" of the bits required for a differential value dx of x-coordinates and the number "bitsy" of the bits required for a differential value dy of y-coordinates are extracted;

(iii) i=1;

(iv) dx and dy are extracted by reading "bitsx" bits and "bitsy" bits, respectively, and then $x_i = x_{i-1} + dx$ and $y_i = y_{i-1} + dy$ are calculated; and (v) 1 is added to the value of i (i=i+1) and the previous step (iv) is performed (n−1) times.

On the other hand, when the EG decoding scheme is determined, the parameter k for EG decoding is extracted from the LASeR binary stream (step 330), and EG decoding is performed using the extracted parameter k (step 340).

In an exemplary embodiment, EG decoding can be performed according to the following process:

When the LASeR binary stream is assumed to be decoded into a point sequence of $(x_0, y_0), (x_1, y_1), \ldots, (x_n, y_n)$, (1) the number of points of the point sequence, the number "bits" of bits used for encoding the points, and the parameter k is extracted from the LASeR binary stream;

(2) "bits" number of bits are read and then the first point coordinates $(x_0, y_0)$ are decoded;

(3) EG code words corresponding to each x-coordinate and y-coordinate differential data between a previous point and a current point are read from the LASeR binary stream and decoded using the parameter k, and the decoded differential data are added to coordinates of the previous point to calculate coordinates of the current point; and (4) the previous step (3) is performed as many times as the number of points excluding the first point.

Specifically, the following process is performed to decode one point $(x_i, y_i)$:

(i) bits are read one at a time until "1" is detected and the total number of read bits is set to M;

(ii) The read "1" is discarded;

(iii) (M+k) bits are read and set to INFO;

(iv) $CodeNum = 2^{M+k} + INFO - 2^k$ is calculated;

(v) dx is calculated from CodeNum;

(vi) $x_i = x_{i-1} + dx$ is calculated;

(vii) Bits are read one by one until "1" is detected and the total number of read bits is set to M;

(viii) The read "1" is discarded;

(ix) (M+k) bits are read and set to INFO;

(x) $CodeNum = 2^{M+k} + INFO - 2^k$ is calculated;

(xi) dy is calculated from CodeNum; and (xii) $y_i = y_{i-1} + dy$ is calculated.

A decoding process for a LASeR binary stream according to the present invention can be expressed with the following syntax and semantics expressed in pseudo code:

syntax:

```
decodingPointSequence {
    nbPoints = Read(lenBits);
    flag = Read(1);
    if (flag == 0) {
        if (nbPoints < 3) {
            bits = Read(5);
            for (int i = 0; i < nbPoints; i++) {
                x[i] = Read(bits);
                y[i] = Read(bits);
            }
        }
        else {
            bits = Read(5);
            x[0] = Read(bits);
            y[0] = Read(bits);
```

-continued

```
            bitsx = Read(5);
            bitsy = Read(5);
            for (int i = 1; i < nbPoints; i++) {
                dx = Read(bitsx);
                dy = Read(bitsy);
                x[i] = dx + x[i - 1];
                y[i] = dy + y[i - 1];
            }
        }
    }
    else {
        bits = Read(5);
        x[0] = Read(bits);
        y[0] = Read(bits);
        kvalue = Read(4);
        for(i = 1; i < nbPoints; i++) {
            1_zero = 0;
            while (Read(1) == 0) 1_zero++;
            Mvalue = 1_zero;
            Read(1);
            INFO = Read(Mvalue + kvalue);
            CodeNum = 2^{M+kvalue} + INFO-2^{kvalue};
            if (CodeNum == 0) dx = 0;
            else if (CodeNum == even) dx = -CodeNum/2;
            else if (CodeNum == odd) dx = (CodeNum + 1)/2;
            x[i] = dx + x[i-1];
            1_zero = 0;
            while (Read(1) == 0) 1_zero++;
            Mvalue = 1_zero;
            Read(1);
            INFO = Read(Mvalue + kvalue);
            CodeNum = 2^{M+kvalue} + INFO-2^{kvalue};
            if (CodeNum == 0) dy = 0;
            else if (CodeNum == even) dy = -CodeNum/2;
            else if (CodeNum == odd) dy = (CodeNum + 1)/2;
            y[i] = dy + y[i - 1];
        }
    }
}
``` semantics:

flag—Flag indicating FL encoding (flag=0) or EG encoding (flag=1).

kvalue—Parameter for EG encoding that varies according to geometric distribution. For example, as kvalue increases, the slope of the geometric distribution becomes gentler.

Mvalue—The number of leading zeros.

CodeNum—Code number.

dx—Differential value between x-coordinate values of a current point and a previous point.

$dx = x[i] - x[i-1]$ dy—Differential value between y-coordinate values of the current point and the previous point.

$dy = y[i] - y[i-1]$

INFO—Value having information about dx or dy.

As an exemplary embodiment, the decoding process for a LASeR binary stream according to the present invention can be expressed using the following syntax written in pseudo code:

syntax:

```
decodingPointSequence {
    nbPoints = Read(lenBits);
    flag = Read(1);
    if (flag == 0) {
        if (nbPoints < 3) {
            bits = Read(5);
            for (int i = 0; i < nbPoints; i++) {
```

-continued

```
      x[i] = Read(bits);
      y[i] = Read(bits);
    }
  }
  else {
    bits = Read(5);
    x[0] = Read(bits);
    y[0] = Read(bits);
    bitsx = Read(5);
    bitsy = Read(5);
    for (int i = 1; i < nbPoints; i++ ) {
      dx = Read(bitsx);
      dy = Read(bitsy);
      x[i] = dx + x[i - 1];
      y[i] = dy + y[i - 1];
    }
  }
}
else {
  kvalue = Read(4);
  bits = Read(5);
  x[0] = Read(bits);
  y[0] = Read(bits);
  for(i = 1; i < nbPoints; i++ ) {
    1_zero = 0;
    while (Read(1) == 0) 1_zero++ ;
    Mvalue = 1_zero;
    Read(1);
    INFO = Read(Mvalue + kvalue);
    CodeNum = 2^(M+kvalue) + INFO-2^kvalue;
    if (CodeNum == 0) dx = 0;
    else if (CodeNum == even) dx = -CodeNum/2;
    else if (CodeNum == odd) dx = (CodeNum + 1)/2;
    x[i] = dx + x[i-1];
    1_zero = 0;
    while (Read(1) == 0) 1_zero++ ;
    Mvalue = 1_zero;
    Read(1);
    INFO = Read(Mvalue + kvalue);
    CodeNum = 2^(M+kvalue) + INFO-2^kvalue;
    if (CodeNum == 0) dy = 0;
    else if (CodeNum == even) dy = -CodeNum/2;
    else if (CodeNum == odd) dy = (CodeNum + 1)/2;
    y[i] = dy + y[i - 1];
  }
 }
}
```

As a modified exemplary embodiment, the decoding process for a LASeR binary stream according to the present invention can be expressed using the following syntax expressed in syntactic description language (SDL) code:

Syntax:

```
decodingPointSequence {
  uivlc5 nbPoints;
  uint(1) flag;
  if (flag == 0) {
    if (nbPoint < 3) {
      uint(5) bits;
      for (int i = 0; i < nbPoints; i++ ) {
        uint(bits) x[i];
        uint(bits) y[i];
      }
    } else {
      uint(5) bits;
      uint(bits) x[0];
      uint(bits) y[0];
      uint(5) bitsx;
      uint(5) bitsy;
      for (int i = 1; i < nbPoints; i++ ) {
        uint(bitsx) dx;
        uint(bitsy) dy;
        x[i] = dx + x[i-1];
        y[i] = dy + y[i-1];
      }
    }
  }
  else {
    uint(4) kvalue;
    uint(5) bits;
    uint(bits) x[0];
    uint(bits) y[0];
    int XMvalue,YMvalue = 0;
    int CodeNum = 0;
    int Diff = 0;
    for(i = 1; i < nbPoints; i++ ) {
      // to calculate X point
      do {
        bit(1) bitX;
        XMvalue++ ;
      } while (bitX == 0);
      const bit(1) endX = 1;
      uint(XMvalue + kvalue) INFO_dx;
      CodeNum = GetCodeNum(kvalue, XMvalue, INFO_dx);
      Diff = GetDiff(CodeNum);
      x[i] = x[i-1] + Diff
      // to calculate Y point
      do {
        unit(1) bitY;
        YMvalue++ ;
      } while (bitY == 0);
      const bit(1) endY = 1;
      uint(YMvalue + kvalue) INFO_dy;
      CodeNum = GetCodeNum(kvalue, YMvalue, INFO_dy);
      Diff = GetDiff(CodeNum);
      Y[i] = y[i-1] + Diff
    }
  }
}
uint GetCodeNum(int k, int Mvalue, int INFO) {
  return 2^(k+Mvalue) + INFO-2^k ;
}
int GetDiff (int CM) {
  if ((CM%2)==0) return-1*CM/2;
  else return CM//2;
}
```

In the above syntax, "%" denotes a modulus operator, and the operator "//" denotes division into a positive number and rounding off the remainder. For example, the value of 1//2 becomes 1, 3//2 becomes 2, and 5//2 becomes 3.

The present invention described above can be provided as a computer-readable medium storing a computer program. The medium can be a floppy disk, a hard disk, a compact disk (CD) read-only memory (ROM), a flash memory card, a programmable read-only memory (PROM), a random-access memory (RAM), a ROM, magnetic tape, etc. In general, the computer program can be made with an arbitrary programming language, for example, C, C++, or JAVA.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A method for encoding LASeR point sequences, comprising the steps of: for each point sequence,
   (a) selecting one of exponential-Golomb (EG) encoding and fixed length (FL) encoding schemes;
   (b) when the FL encoding scheme is selected, encoding the point sequence using the FL encoding scheme to generate a binary stream; and (c) when the EG encoding scheme is selected, encoding the point sequence using the EG encoding scheme to generate a binary stream, wherein the binary stream includes a flag indicating which encoding scheme is selected and a parameter k, with which the EG encoding can be most effectively performed, when the EG encoding scheme is selected.

2. The method according to claim 1, wherein step (c) further includes calculating the parameter k with which the EG encoding can be most effectively performed.

3. The method according to claim 1, wherein, in step (a), both the EG encoding and the FL encoding schemes are performed on the point sequence and the encoding scheme that generates the smallest number of bits is selected.

4. The method according to claim 1, wherein in step (b), the FL encoding scheme includes the steps of: for the point sequence of $(x_0, y_0), (x_1, y_1), \ldots, (x_n, y_n)$, (b1) when the number of points in the point sequence is two or less, (b1-i) calculating and encoding the minimum number of bits with which the point coordinates $(x_0, y_0)$ and $(x_1, y_1)$ can be encoded, and (b1-ii) encoding the point coordinates $(x_0, y_0)$ and $(x_1, y_1)$ using the minimum number of bits; and (b2) when the number of points in the point sequence is more than two, (b2-i) calculating and encoding the minimum number of bits with which the first point coordinates $(x_0, y_0)$ can be encoded;

(b2-ii) encoding the first point coordinates $(x_0, y_0)$ using the minimum number of bits;

(b2-iii) calculating x-coordinate differential data, $dx_{10}, \ldots, dx_{nn-1}$ (here, $dx_{nn-1}=x_n x_{n-1}$) between adjacent points and the number of bits required for encoding the x-coordinate differential data;

(b2-iv) calculating y-coordinate differential data $dy_{10}, \ldots, dy_{nn-1}$ (here, $dy_{nn-1}=y_n y_{n-1}$) between adjacent points and the number of bits required for encoding the y-coordinate differential data;

(b2-v) encoding the number of bits required for encoding the x-coordinate differential data and the number of bits required for encoding the y-coordinate differential data; and (b2-vi) encoding the x-coordinate differential data and the y-coordinate differential data.

5. The method according to claim 1, wherein in step (c), the EG encoding scheme includes the steps of: for the point sequence of $(x_0, y_0), (x_1, y_1), \ldots, (x_n, y_n)$, (c1) calculating and encoding the minimum number of bits with which the first coordinates $(x_0, y_0)$ can be encoded;

(c2) encoding the first point coordinates $(x_0, y_0)$ using the minimum number of bits; and (c3) for each point except the first point, mapping x-coordinate and y-coordinate differential data between a previous point and the current point into respective EG code numbers according to a predetermined rule, generating respective EG codewords corresponding to the x-coordinate and y-coordinate differential data using the EG code numbers and the parameter k.

6. The method according to claim 5, wherein step (c3) includes the steps of, for each point except the first point:

(c3-i) mapping x-coordinate differential data between a previous point and the current point into a EG code number, CodeNum, according to the predetermined rule;

(c3-ii) calculating the number M of leading zeros and a suffix offset INFO carrying information using the EG code number CodeNum obtained in step (c3-i);

(c3-iii) concatenating M number of "0" bits calculated in (c3-ii), one "1" bit, and the suffix offset INFO of (M+k) bits to generate the EG codeword corresponding to the x-coordinate differential data;

(c3-iv) mapping y-coordinate differential data between the previous point and the current point into an EG code number CodeNum according to the predetermined rule;

(c3-v) calculating the number M of leading zeros and a suffix offset, INFO carrying information using the EG code number CodeNum obtained in step (c3-iv); and (c3-vi) concatenating M number of "0" bits calculated in (c3-v), one "1" bit, and the suffix offset INFO of (M+k) bits to generate an EG codeword corresponding to the y-coordinate differential data.

7. A method for decoding a LASeR binary stream, comprising the steps of:

extracting, from the LASeR binary stream, information indicating which encoding scheme is used, and determining one of EG decoding and FL decoding schemes on the basis of the extracted information; and decoding the LASeR binary stream according to the determined decoding scheme.

8. The method according to claim 7, wherein when the FL decoding scheme is determined and the LASeR binary stream is decoded into a point sequence of $(x_0, y_0), (x_1, y_1), \ldots, (x_n, y_n)$, the step of decoding the LASeR binary stream according to the determined decoding scheme includes the steps of:

(a) reading information about the number of points in the point sequence and the number (BITS) of bits used for encoding the points from the LASeR binary stream;

(b) when the number of points is two or less, reading the bits sequentially, by the BITS number of bits and decoding coordinates of the two or less points; and (c) when the number of points is more than two, (c1) reading the bits in order, by the BITS number of bits, and decoding the first point coordinates $(x_0, y_0)$, (c2) reading information about the numbers (BITSX and BITSY) of bits used for encoding x-coordinate and y-coordinate differential data between adjacent points in order from the LASeR binary stream, (c3) reading the bits corresponding to each of the numbers BITSX and BITSY in order and decoding each of the x-coordinate and y-coordinate differential data between a previous point and a current point, and adding the decoded x-coordinate and y-coordinate differential data to the previous point coordinates to calculate the current point coordinates; and (c4) repeating step (c3) as many times as the number of points in the sequence excluding the first point.

9. The method according to claim 7, wherein when the EG decoding scheme is determined, the step of decoding the LASeR binary stream according to the determined decoding scheme includes the steps of:

extracting a parameter k required for EG decoding from the LASeR binary stream; and decoding the LASeR binary stream using the parameter k according to the EG decoding scheme.

10. The method according to claim 9, wherein when the LASeR binary stream is decoded into a point sequence of $(x_0, y_0), (x_1, y_1), \ldots, (x_n, y_n)$, the step of decoding the LASeR binary stream using the parameter k according to the EG decoding scheme includes the steps of:

(a) reading information about the number of points in the point sequence, the number (BITS) of bits used for encoding the points, and the parameter k from the LASeR binary stream;
(b) reading the bits by the BITS number of bits in order and decoding the first point coordinates $(x_0, y_0)$;
(c) reading EG code words corresponding to x-coordinate and y-coordinate differential data between a previous point and a current point from the LASeR binary stream and decoding the x-coordinate and y-coordinate differential data using the parameter k, and adding the decoded x-coordinate and y-coordinate differential data to the previous point coordinates to calculate the current point coordinates; and
(d) repeating step (c) as many times as the number of points in the sequence excluding the first point.

11. A server comprising:
an encoding means for encoding LASeR point sequences representing a scene description by performing a method according to any one of claims 1 to 6 to generate an encoded LASeR scene description stream;
a multiplexing means for multiplexing the encoded LASeR scene description stream and other element streams composing the LASeR scene to generate a multiplexed LASeR binary stream; and
a transmitting means for transmitting the multiplexed LASeR binary stream to a user terminal.

12. A user terminal comprising:
a receiving means for receiving a LASeR binary stream;
a demultiplexing means for demultiplexing and outputting a LASeR scene description stream and other element streams from the received LASeR binary stream;
a decoding means for decoding a LASeR scene description stream output from the demultiplexing means by performing a method according to any one of claims 7 to 10 to generate a plurality of decoded LASeR access units which can be separately accessed;
an additional decoding means for decoding the other element streams output from the demultiplexing means;
a scene tree manager for generating a scene tree from the decoded access units; and
a LASeR renderer for providing a LASeR service using the generated scene tree and the decoded other element streams.

13. A computer readable recording medium having a computer program thereon, which performs the method for encoding LASeR point sequences according to any one of claims 1 to 6.

14. A computer readable recording medium having a computer program thereon, which performs the method for decoding a LASeR binary stream according to any one of claims 7 to 10.

15. A data structure of a data stream of an encoded LASeR point sequence, comprising:
a flag for indicating which one of FL and EG encoding schemes is used; and
a parameter k with which the EG encoding can be most effectively performed, when the flag has a value indicating the EG encoding scheme.

16. An encoder comprising:
a LASeR scene encoder for encoding LASeR point sequences representing a scene description by performing a method according to any one of claims 1 to 6 to generate an encoded LASeR scene description stream;
a multiplexer for multiplexing the encoded LASeR scene description stream and other element streams composing the LASeR scene to generate a multiplexed LASeR binary stream; and
an output for outputting the multiplexed LASeR binary stream.

17. A decoder comprising:
an input for receiving a LASeR binary stream;
a demultiplexer for outputting a LASeR scene description stream and other element streams from the input LASeR binary stream;
a LASeR scene decoder for decoding the LASeR scene description stream output from the demultiplexer by performing a method according to one of claim 7 to 10 to generate a plurality of decoded LASeR access units which can be separately accessed;
other element decoder for decoding the other element streams output from the demultiplexer;
a scene tree manager for generating a scene tree from the decoded access units; and
a LASeR renderer for providing a LASeR service to a user using the generated scene tree and the decoded other element streams.

* * * * *